United States Patent [19]
Izumi et al.

[11] Patent Number: 5,652,178
[45] Date of Patent: Jul. 29, 1997

[54] METHOD OF MANUFACTURING A LIGHT EMITTING DIODE USING LPE AT DIFFERENT TEMPERATURES

[75] Inventors: Tadasu Izumi, Nara-ken; Masamichi Harada, Yamatokooriyama; Yukari Inoguchi, Nara, all of Japan

[73] Assignee: Sharp Kabushiki Kaisha, Osaka, Japan

[21] Appl. No.: 466,279

[22] Filed: Jun. 6, 1995

Related U.S. Application Data

[60] Division of Ser. No. 798,130, Nov. 26, 1991, and a continuation-in-part of Ser. No. 513,885, Apr. 24, 1990, abandoned.

[30] Foreign Application Priority Data

Apr. 28, 1989 [JP] Japan .................. 1-109931
Jun. 5, 1991 [JP] Japan .................. 3-134116

[51] Int. Cl.⁶ .................................................. H01L 21/20
[52] U.S. Cl. .......................... 437/112; 437/118; 437/119; 117/56; 257/89
[58] Field of Search .................... 437/114, 119, 437/125, 118, 112, 904, 905, 906; 117/54, 56, 57, 58, 61; 148/DIG. 101, DIG. 66; 257/89

[56] References Cited

U.S. PATENT DOCUMENTS

| | | |
|---|---|---|
| 3,581,162 | 5/1971 | Wheatley . |
| 3,595,991 | 7/1971 | Diller . |
| 3,611,069 | 10/1971 | Fenner et al. . |
| 3,646,406 | 2/1972 | Logan et al. . |
| 3,647,579 | 3/1972 | Ladany . |
| 3,875,456 | 4/1975 | Kano et al. . |
| 3,875,473 | 4/1975 | Lebailly . |
| 3,935,039 | 1/1976 | Beppu et al. . |
| 3,942,185 | 3/1976 | Lebailly . |
| 4,560,901 | 12/1985 | Thillays . |
| 4,671,829 | 6/1987 | Kuwubata et al. . |

FOREIGN PATENT DOCUMENTS

| | | |
|---|---|---|
| 37486 | 3/1979 | Japan . |
| 53974 | 4/1979 | Japan . |
| 24985 | 3/1981 | Japan . |
| 91688 | 5/1983 | Japan . |
| 87881 | 5/1984 | Japan . |
| 55974 | 8/1987 | Japan . |

OTHER PUBLICATIONS

Thin Film Process, edited by J. Vossen and W. Kern, RCA Laboratories, Academic Press 1978.

O.G. Lorimor, et al. "Very High Efficiency GaP Green Light Emitting Diodes" J. Electrochem. Soc. (USA) vol. 122, No. 3 (Mar. 1975).

Primary Examiner—Charles L. Bowers, Jr.
Assistant Examiner—Ramamohan Rao Paladugu

[57] ABSTRACT

A method of manufacturing a light emitting diode, which includes the steps of bringing a semiconductor substrate of p-type or n-type into contact with a growth solution at a high temperature and thereafter, lowering the temperature so as to form a monocrystalline epitaxial layer of the same type as the semiconductor substrate on the semiconductor substrate, subsequently, further lowering the above temperature to form a first monocrystalline epitaxial layer of a reverse type to the epitaxial layer on the epitaxial layer and then, cutting off the growth solution to form an epitaxial wafer as a result, a growth solution to contact the first epitaxial layer of a epitaxial wafer at a high temperature, and thereafter, the temperature is lowered to form a second monocrystalline epitaxial layer of the same kind and type as the first epitaxial layer on the first epitaxial layer.

20 Claims, 4 Drawing Sheets

METHOD OF MANUFACTURING A LIGHT EMITTING DIODE USING LPE AT DIFFERENT TEMPERATURES

This application is a divisional of copending application Ser. No. 07/798,130, filed on Nov. 26, 1991, and Continuation-In-Part of Ser. No. 07/513,885, filed on Apr. 24, 1990, abandoned, the entire contents of which are hereby incorporated by reference.

BACKGROUND OF THE INVENTION

The present invention generally relates to a light emitting diode, and more particularly, to a method of manufacturing, for example, a GaP green light emitting diode to be simultaneously used with a GaAlAs light emitting diode which emits red light.

As shown in FIG. 5(a), a GaAlAs red light emitting diode employing a p-type substrate includes a p-type substrate 3 of GaAlAs, a p-type epitaxial layer 2 of GaAlAs, and an n-type epitaxial layer 1 of GaAlAs.

On the other hand, as illustrated in FIG. 5(b), a GaP green light emitting diode employing an n-type substrate to be used in a light emitting diode for two color emission includes an n-type substrate 4 of GaP, an n-type epitaxial layer 5 of GaP, and a p-type epitaxial layer 6 of GaP.

In the GaP green light emitting diode referred to above, the p-n junction height is far less than the p-n junction height of the GaAlAs red light emitting diode when both light emitting diodes are mounted on mounting surface 7 as shown in FIGS. 5(a) and 5(b). Therefore, it is necessary to increase the p-n junction height of the GaP green light emitting diode (i.e. in the vicinity of the position of the p-n junction of the GaAlAs red light emitting diode) as much as possible for better light deriving effect and simplicity in assembly. For this purpose, the p-type GaP epitaxial layer 6 of the GaP green light emitting diode must be increased in its thickness.

In order to increase the p-n junction height, it is necessary to increase the thickness of the p-type GaP epitaxial layer 6 for the GaP green light emitting diode. The following methods are available:

(1) raising a growth temperature of a liquid phase epitaxial layer during formation of the epitaxial layer based on the liquid phase epitaxial method;
(2) increasing the thickness of the growth solution;
(3) raising the junction forming temperature; and
(4) lowering the cooling temperature.

However, in the conventional liquid phase epitaxial method, there is a problem that, when the growth temperature of the liquid phase epitaxial layer is raised, an amount of nitrogen (N) to be doped at the gaseous phase simultaneously with the growth is undesirably varied. Meanwhile, if the thickness of the growth solution is increased, the flatness of the surface of the epitaxial layer is deteriorated. Furthermore, raising the junction forming temperature or lowering the cooling temperature, results in light emitting diodes which are unsatisfactory from a brightness standpoint.

Recently, a two color emission element has been used as an outdoor light display element which is formed by combining a GaAlAs red light emitting diode using a p-type substrate and a GaP green light emitting diode using a n-type substrate. The GaAlAs red light emitting diode is constituted by a p-n junction (made of GaAlAs epitaxial layers) formed on a p-type GaAlAs substrate, and mounted on a surface 7 with said substrate being disposed next to the mounting surface 7. On the other hand, said GaP green light emitting diode is constituted by a p-n junction (made of GaP epitaxial layers) formed on a n-type GaP substrate, and mounted on the surface with the substrate side being disposed furthest from the mounting surface 7. This configuration is shown in FIGS. 5(a) and 5(b). In this arrangement, the p-n junction height of said GaP green light emitting diode is also located below the p-n junction height for the GaAlAs red light emitting diode. Therefore, it is necessary to raise the p-n junction height of the GaP green light emitting diode as much (i.e. in the vicinity of the p-n junction height of the GaAlAs red light emitting diode) as possible for better light deriving effect and simplicity in assembly.

Therefore, there has been proposed a GaP green light emitting diode as shown in FIG. 1 in which a n-type GaP epitaxial layer 12 and a first p-type epitaxial layer 13 are formed on a GaP substrate 11 and an extra p-type GaP epitaxial layer 14 is formed to raise the p-n junction height of the GaP green light emitting diode such that the p-n junction heights of the GaP and GaAlAs diodes are matched.

SUMMARY OF THE INVENTION

Accordingly, an essential object of the present invention is to provide a method of manufacturing a light emitting diode having proper characteristics, in which the p-n junction height is raised by increasing the thickness of the epitaxial layer.

Another object of the present invention is to provide a method of manufacturing a light emitting diode as described above, wherein the flatness of the epitaxial layer and the brightness of the light emitting diode are satisfactory.

Another object of the present invention is to provide a method of manufacturing a light emitting diode as described above, wherein a green GaP light emitting diode formed by this process may be combined with a red GaAlAs light emitting diode wherein the p-n junction heights of both diodes are matched for better light deriving effects and for simplicity in assembly.

Another object of the present invention is to provide a method of manufacturing a light emitting diode as described above, which has simple manufacturing procedures and may be readily incorporated into a production line at a low cost.

Accordingly, an essential object of the present invention is to provide a manufacturing method for a light emitting diode which raises the p-n junction height by increasing the thickness of the epitaxial layer below the p-n junction and does not cause a resulting decrease in brightness.

In accomplishing these and other objects, according to one preferred embodiment of the present invention, there is provided a method of manufacturing a light emitting diode, which includes the steps of bringing a semiconductor substrate of p-type or n-type into contact with a growth solution at a high temperature and thereafter, lowering the temperature so as to form a monocrystalline epitaxial layer of the same type as the semiconductor substrate on the semiconductor substrate, subsequently, further lowering the above temperature to form a first monocrystalline epitaxial layer of a reverse type to the epitaxial layer on the epitaxial layer, cutting off the growth solution to form an epitaxial wafer which causes the growth solution to contact the first epitaxial layer of the epitaxial wafer at a high temperature, and thereafter, lowering the temperature to form a second monocrystalline epitaxial layer of the same kind and type as the first epitaxial layer on the first epitaxial layer.

Further, by varying the formation conditions, the brightness of said light emitting diode is improved as the thickness of the first epitaxial layer increases, and in the case where said first epitaxial layer is formed to be of more than 35 μm thickness (more than two times the conventional thickness of 15 μm), the brightness can be maintained approximately the same as in the case where a second epitaxial layer is formed. Accordingly, the p-n junction can be raised by increasing the thickness of the epitaxial layer under the p-n junction and the brightness lowering can be prevented.

By the steps according to the present invention as described above, an improved method of manufacturing a light emitting diode has been presented through simple steps, which substantially eliminates the disadvantages inherent in the conventional methods of this kind.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENTS

Figure 1:
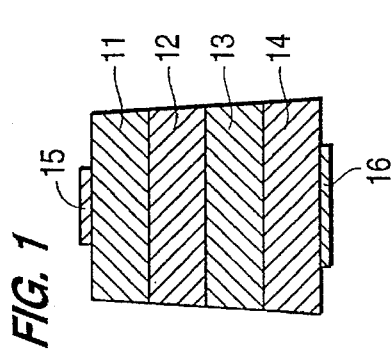
FIG. 1 is a schematic side sectional view illustrating the general construction of a GaP green light emitting diode according to one preferred embodiment of the present invention.

Before the description of the present invention proceeds, it is to be noted that like parts are designated by like reference numerals throughout the accompanying drawings.

According to an embodiment of the present invention, for preparing a light emitting diode in the vicinity of a p-n junction related to light emission of the light emitting diode, an epitaxial layer is formed by a conventional liquid phase epitaxial process, for preparing an optimum epitaxial wafer. Thereafter, by further forming on the epitaxial wafer thus obtained, another epitaxial layer of a same kind and same type, a light emitting diode having the thick epitaxial layer which forms the p-n junction is obtained.

In FIG. 1, there is shown the general construction of a GaP green light emitting diode according to a preferred embodiment of the present invention, which generally includes a sulphur doped n-type (1,1,1) GaP substrate 11, an n-type GaP epitaxial layer 12, and a first p-type GaP epitaxial layer 13. The n-type GaP epitaxial layer 12 and the first p-type GaP epitaxial layer 13 are formed by a conventional liquid phase epitaxial process. In this embodiment, a second p-type GaP epitaxial layer 14 is also formed on the first p-type GaP layer 13.

Figure 2:
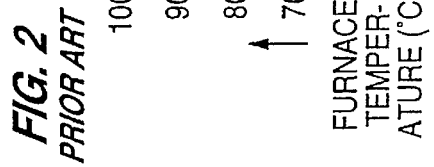
FIG. 2 is a graphic diagram illustrating one example of a time-chart in a liquid phase epitaxial method for a p-n junction formation.

The GaP green light emitting diode having the construction as described above is formed in the manner as explained hereinafter. Firstly, according to a time-chart of a conventional liquid phase epitaxial process as illustrated in FIG. 2, for example, the n-type GaP epitaxial layer 12 and the first p-type GaP epitaxial layer 13 are continuously formed over the n-type GaP substrate 11 as illustrated in FIG. 1 to thereby form a GaP epitaxial wafer.

The GaP epitaxial wafer referred to above is prepared as follows. A furnace loaded with a liquid phase growth boat is raised in temperature up to 1000° according to a program, and after holding at that temperature for 5 to 100 minutes (90 minutes in a preferred embodiment), a growth solution (Ga fused liquid) is brought into contact with the n-type GaP substrate 11. After cooling the furnace at a predetermined temperature gradient in the range of 0.05° to 3.0° C./min (1.0° C./min in a preferred embodiment), ammonium gas ($NH_3$) mixed with carrier gas of hydrogen ($H_2$) is fed into the furnace for doping of nitrogen (N). After the temperature of the furnace has reached 900° C., a zinc (Zn) vapor is added to effect of p-type doping. The temperature of the furnace is maintained at 900° C. for 5 to 60 minutes (50 minutes in a preferred embodiment), and thereafter, the supply of ammonium gas ($NH_3$) is suspended. The furnace is again cooled in temperature at a predetermined temperature gradient of 0.1° to 5.0° C./min (1° C./min in a preferred embodiment), and the growth solution is cut off at the time point when the furnace temperature has reached 830° C. so as to further lower the furnace temperature continuously. In the above case, since the growth temperature of the liquid phase epitaxial layer, the thickness of the growth solution, the junction forming temperature, and the cooling temperature, can be properly controlled, a GaP epitaxial wafer having optimum conditions with respect to such characteristics as the amount of impurities to be doped, the flatness of the surface of the GaP epitaxial layer, and the brightness, etc. may be prepared.

Figure 3:
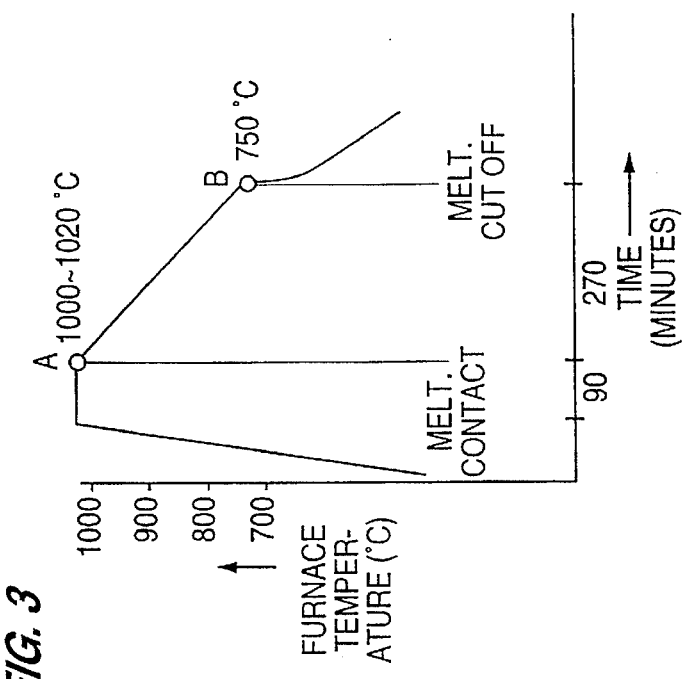
FIG. 3 is a graphic diagram illustrating one example of a time-chart in an epitaxial layer growing method according to the present invention.

Thereafter, the GaP epitaxial wafer is taken out for a pretreatment, and then, according to a time-chart as illustrated in FIG. 3, for example, the second p-type GaP epitaxial layer 14 is grown based on the slide process.

The pretreatment process for the GaP epitaxial wafer includes employing an etching solution of the aqua regia (nitrohydrochloric acid) group to obtain a clean surface by etching the p-type layer 13 on the GaP substrate. Using aqua regia etching, the p-type layer 13 is thinned by 1 to 4 μm, and adhering Ga atoms and a surface oxidation film are removed. If the above pretreatment is not performed, a boundary face is formed which tends to form an electrically faulty light emitting diode, with a nonuniform epitaxial growth. The pretreatment process may also be performed using a sulfuric acid group solution. A comparative table between the two etching solutions is shown below.

| Compositions | Temperature | Etching speeds |
|---|---|---|
| aqua regia | | |
| $H_2NO_3$:1 $HCl$:3 | Boiling temp. above 100° C. | ~1 µm/min |
| sulfuric acid | | |
| $H_2SO_4$:3 $H_2O_2$:1 $H_2O$:1 | ~60°0 C. | 0.1 ~ 0.2 µm/min |

The use of etching solutions for pretreating GaP wafers produced by a thin film processes is illustrated in *Thin Film Processes*, edited by Vossen & Kern, RCA Laboratories, Academic Press, New York, 1978.

Figure 4A:
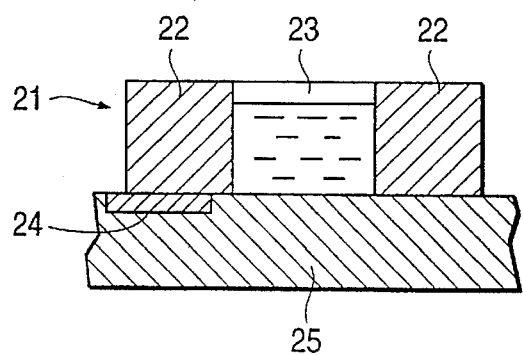
FIGS. 4(a) and 4(b) are sectional diagrams for explaining the states of a "boat" to be used for effecting the epitaxial layer growing method of FIG. 3.
Figure 4B:
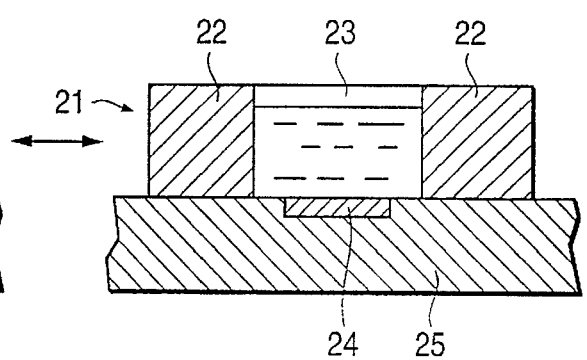

FIGS. 4(a) and 4(b) show a general construction of a boat 21 for the growth employed in the formation of the second p-type GaP epitaxial layer 14 according to the method of the present invention.

The boat 21 having one bath 23 including a slider 22, etc., is made of a highly pure carbon material, and the bath 23 is arranged to be slidable by the slider 22. The growth solution to be accommodated within the bath 23 is prepared by dissolving zinc (Zn) at 0.0006 with respect to Ga at 1 by weight ratio.

The second p-type monocrystalline epitaxial layer is then formed as illustrated in FIG. 3 and as described below. At a point A, the furnace temperature is held at 1000° C. to 1020° C. for 5 to 100 minutes (1020° C. for 90 minutes in a preferred embodiment), as shown in the time-chart of FIG. 3. The slider 22 is then slid to bring the boat 21 from the state of FIG. 4(a) to FIG. 4(b), so as to cause the growth solution with the bath 23 to contact the GaP epitaxial wafer 24 on a substrate holder 25. Thus, after the second p-type GaP epitaxial layer 14 has been grown through lowering of the furnace temperature at the predetermined temperature gradient of 0.1° C. to 5.° C./min (1° C./min in a preferred embodiment), the boat 21 is immediately slid to point B into the state of FIG. 4(a), as a result the growth solution from the GaP epitaxial wafer 24 is cut off.

The respective layers, immediately after completion of the epitaxial growth in the above described manner, have approximate thickness wherein the n-type GaP substrate 11 is 250 µm, the n-type GaP epitaxial layer 12 is 70 µm, the first p-type GaP epitaxial layer 13 is 30 µm, and the second p-type GaP epitaxial layer 14 is 130 µm. Thereafter, the surface of the n-type GaP substrate 11 is scraped off to produce a thickness down to 30 µm by lapping thereby forming an AuSi electrode 15, while an AuBe electrode 16 is formed on the surface of the second p-type GaP epitaxial layer 14. Thereby the green GaP light emitting diode chip is provided.

As described so far, in the method of manufacturing a green GaP light emitting diode according to the present embodiment, the n-type GaP substrate 11 and the growth solution are first brought into contact with each other at a high temperature by an ordinary liquid phase epitaxial process, and the n-type GaP epitaxial layer 12 and the first p-type GaP epitaxial layer 13 are formed while the temperature is being lowered for preparing the GaP epitaxial wafer 24. Subsequently, the second p-type GaP epitaxial layer 14 of the same type as the first p-type GaP epitaxial layer 13 is grown on the epitaxial layer 13 of the epitaxial wafer 24.

Therefore, in the green GaP light emitting diode thus prepared, the thickness of the p-type GaP epitaxial layer maybe formed to be thick, and thus, the position of the p-n junction height can be increased as much as possible.

In another preferred embodiment, the manufacturing method for a light emitting diode according to the present invention is so arranged that, after bringing a semiconductor substrate of p-type or n-type and a growth solution into contact with each other at a high temperature, said temperature is lowered so as to form a monocrystalline epitaxial layer of the same type as said semiconductor substrate on said semiconductor substrate, subsequently, said temperature is lowered to form a first monocrystalline epitaxial layer of a reverse type to said epitaxial layer on said epitaxial layer, and then, said growth solution is cut off, subsequently, after causing a growth solution to contact the first epitaxial layer of said epitaxial a wafer at a high temperature, the temperature is further lowered so as to form a second monocrystalline epitaxial layer of the same kind and type as the first epitaxial layer, and said first epitaxial layer is formed to be of a thickness of more than 35 µm, but less than 50 µm. With this arrangement, said manufacturing method can form the p-n junction height higher by making the total thickness of said first and second epitaxial layers thicker than conventional layers. Accordingly, in the case where the two color light emitting diode are mounted together, a GaAlAs red light emitting diode and a GaP green light emitting diode are combined to be used simultaneously, it is possible to match the p-n junction height of the GaAlAs red light emitting diode and the position of the p-n junction of the GaP green light emitting diode, thereby increasing the light deriving effect and simplifying assembly. Furthermore, since said first epitaxial layer is thick, it is possible to completely prevent the adverse effect on the p-n junction from taking place when the second epitaxial layer grows. Therefore, the brightness lowering after completion thereof can be effectively prevented.

By the above arrangement of the present embodiment, when the GaP green light emitting diode as obtained by the foregoing embodiment is to be simultaneously used with a GaAlAs red light emitting diode employing the p-type substrate as a two-color light emitting diode, the p-n junction height of the GaAlAs red light emitting diode may be matched to the p-n junction height of the GaP green light emitting diode and as a result, the light deriving effect is improved, and the assembly of the diode is simplified.

In the above case, in the process of preparing the p-n junction of the above green GaP light emitting diode, since the growing temperature of the liquid phase epitaxial layer is not particularly raised with respect to the conventional liquid phase epitaxial process, the amount of gas to be doped in the gaseous phase simultaneously with the growth is not varied. Moreover, since the thickness of the growth solution is not increased, flatness on the surface of the epitaxial layer is not deteriorated. Furthermore, owing to the fact that the junction forming temperature is not varied, light emitting diodes having satisfactory brightness may be obtained.

Further, the time-chart for the conventional liquid phase epitaxial process and the time-chart for the growing process of the second epitaxial layer as referred to in the present specification are not limited to those as quoted in the above embodiment, but may be varied in various ways within the scope.

Accordingly, by way of example, the p-n junction height of the GaP green light emitting diode using the n-type substrate as prepared by the present embodiment may be raised. In other words, when the GaP green light emitting diode of the present embodiment is to be simultaneously used with the GaAlAs red light emitting diode using the p-type substrate as a two color light emitting diode, the p-n junction height of the GaAlAs red light emitting diode and the p-n junction height of the GaP green light emitting diode may be matched, with consequent improvement in the light deriving effect, and simplification of assembly.

Figure 6A:
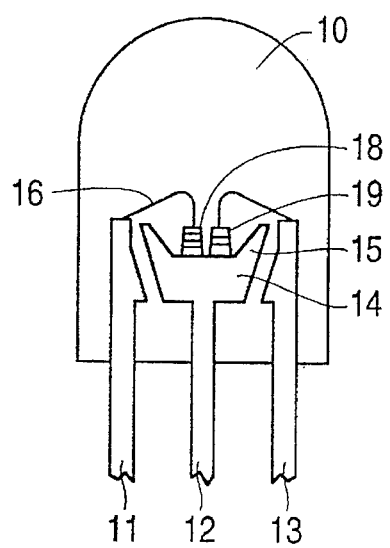
FIG. 6(a) is a diagram of a diode chip including a GaP green light emitting diode manufactured by a method of present application and a conventional GaAlAs red light emitting diode.

The diode chip including the GaAlAs and GaP light emitting diodes is illustrated in FIG. 6(a).

Figure 6B:
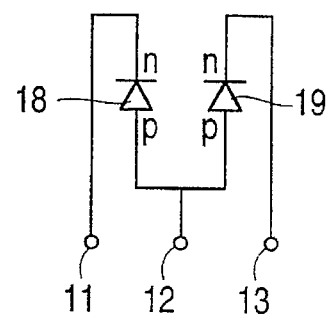
FIG. 6(b) is a schematic illustration of FIG. 6(a)

Lead frames 11, 12, and 13 are made of metallic plates, and the central lead frame 12 has a concave head portion to form a cup 14, which serves as the bonding portion and reflecting portion of the diode chip 10. For both the GaP 18 and GaAlAs 19 light emitting diode, die-bonding to the cup is effected at the p side electrode through employment of the silver paste 15, etc., while the n side electrode is connected by wire bonding to gold wire 16. FIG. 6(b) is a schematic diagram of FIG. 6(a).

The thickness of the layers formed by the first embodiment of the method of the present application for the GaP light emitting diode 18 are as follows:

| LAYER | THICKNESS |
| --- | --- |
| GaP substrate 11 | 30 μm |
| n-type epitaxial layer 12 | 70 μm |
| p-type epitaxial layer 13 | 30 μm |
| p-type epitaxial layer 14 | 130 μm |

Therefore, the height of the p-n junction is 160 μm.

The thickness of the layers formed by the second embodiment of the method of the present application for the GaP light emitting diode 18 are as follows:

| LAYER | THICKNESS |
| --- | --- |
| GaP substrate 11 | 30 μm |
| n-type epitaxial layer 12 | 65 μm |
| p-type epitaxial layer 13 | 35 μm |
| p-type epitaxial layer 14 | 130 μm |

Therefore, the height of the p-n junction is 165 μm.

For the GaAlAs light emitting diode 9 the thickness of the layers are as follows:

| LAYER | THICKNESS |
| --- | --- |
| n-type epitaxial layer | 35 μm |
| p-type epitaxial layer 2 | 15 μm |
| p-type GaAlAs substrate 3 | 140 μm |

Accordingly, the height of the p-n junction is 155 μm.

Figure 5A:
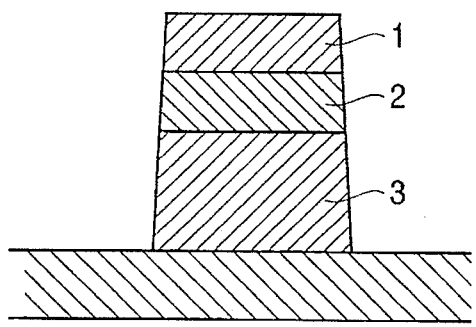
FIG. 5(a) is a schematic side sectional view of a conventional GaAlAs red color light emitting diode.
Figure 5B:
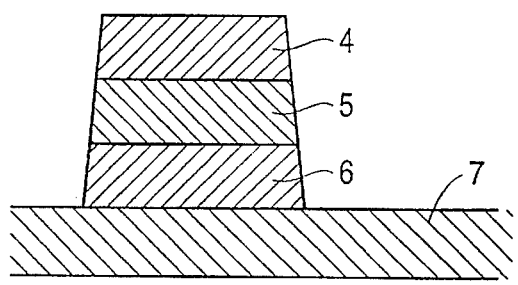
FIG. 5(b) is a schematic side sectional view of a conventional GaP green light emitting diode.

In the GaAlAs diode, besides the element construction such as the p-type substrate/p-type epitaxial layer/n-type epitaxial layer (single junction structure) shown in FIG. 5(a), there are available the element construction such as: p-type substrate/p-type epitaxial layer/p-type active layer/n-type epitaxial layer (double-hetero-junction structure), and p-type epitaxial layer/p-type active layer/n-type epitaxial layer without any p-type active layer/n-type epitaxial layer without any p-type substrate (double-hetero-junction structure), and the junction heights are respectively different from each other.

In any case, however, the GaAlAs diode has a high p-n junction height, and if the GaP diode is die-bonded at the p electrode side, with the conventional construction kept as is (without the second p-type epitaxial layer), the position of the p-n junctions may differ considerably. In this respect, matching the junction positions can be achieved by the present invention.

Figure 7:
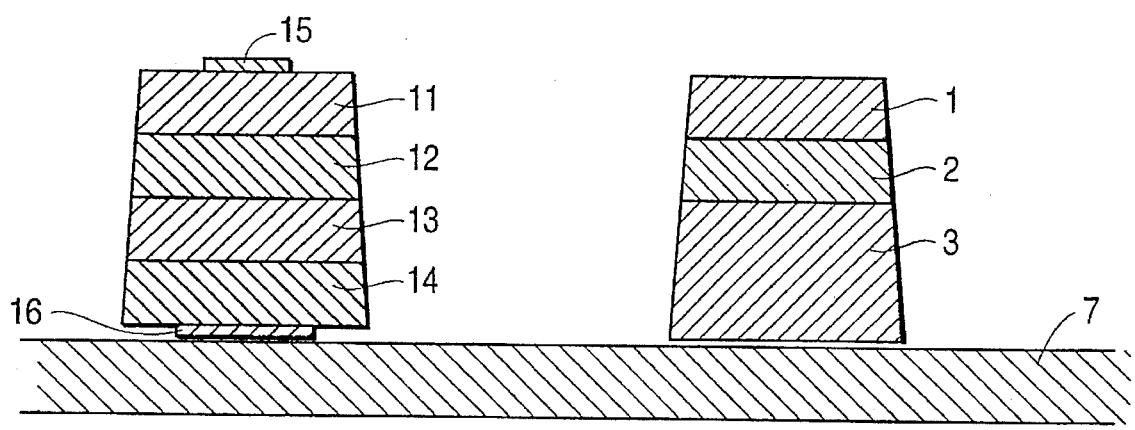
FIG. 7 is a diagram of a GaP green light emitting diode manufactured by a method of the present application and a conventional GaAlAs red light emitting diode mounted on a mounting surface with matched p-n junction heights.

A green GaP light emitting diode formed by the method of the present application and a red GaAlAs light emitting diode, are shown in FIG. 7 mounted to a mounting surface 7. Further, in FIG. 7, the p-n junction heights of both light emitting diodes are matched exactly.

It should be noted here that the junction positions need not necessarily be matched exactly, but may be such that, in the case of a p-n junction height of 160 μm for one diode, the other diode may, for example, be in the range of 120 μm to 180 μm.

Figure 8A:
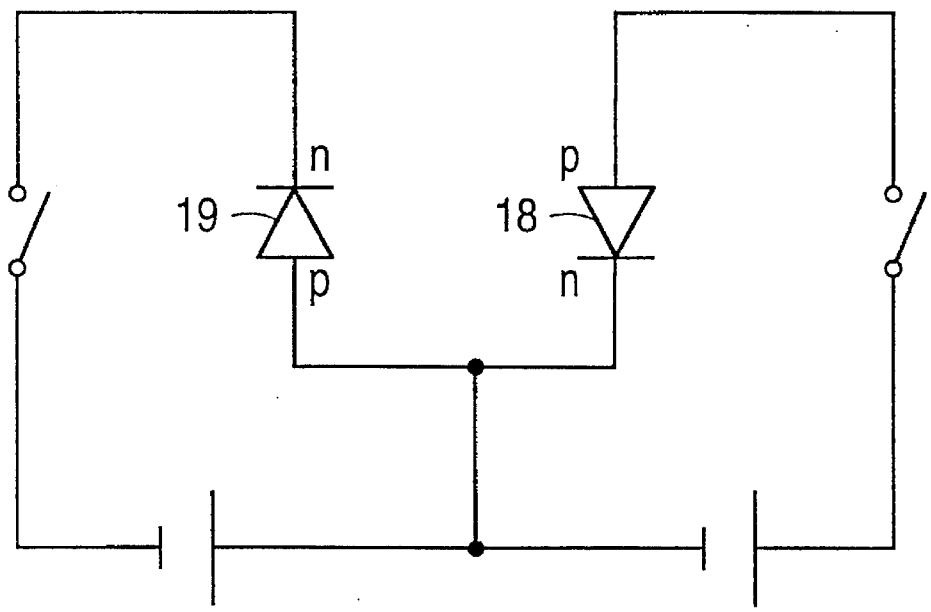
FIG. 8(a) is a schematic diagram of a conventional arrangement where two power supplies are necessary to drive a GaP green and a GaAlAs red light emitting diode.
Figure 8B:
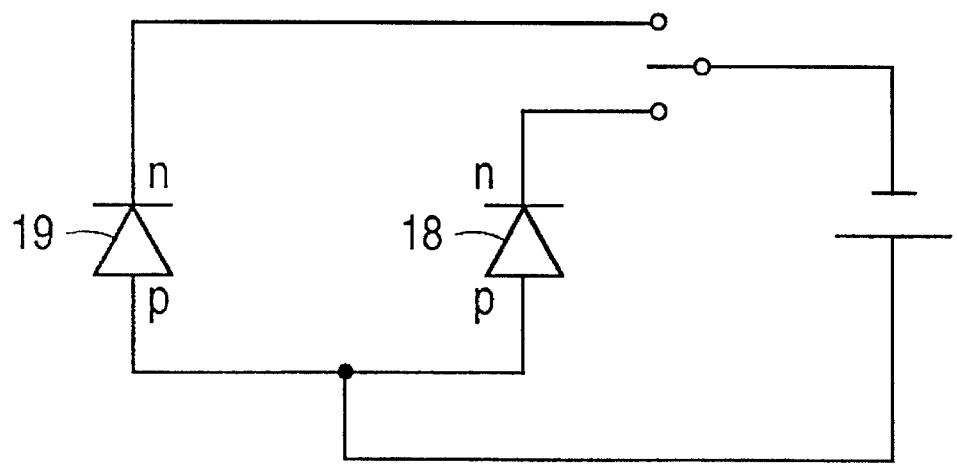
FIG. 8(b) is a schematic diagram of a device of the present application wherein only one power supply is necessary to drive both the GaP green and GaAlAs red light emitting diodes.

Further, as a result of optical and electrical characteristics of both the green GaP and red GaAlAs light emitting diodes, the red GaAlAs light emitting diode is grown from a p-type substrate, while the green GaP light emitting diode is grown from an n-type substrate. Most of the light emitting diodes currently used in practical applications also employ the above substrates. An additional advantage to the combination of the green GaP light emitting diode and red GaAlAs light emitting diode as configured in FIG. 7 is that only one power supply is required to drive both light emitting diodes. This advantage is further illustrated in FIGS. 8(a) and 8(b). As shown in FIG. 8(a), if both light emitting diodes are orientated with their substrates disposed next to the mounting surface, then two power supplies are required, one to drive each of the light emitting diodes. However, if the green GaP and red GaAlAs light emitting diodes are oriented as shown in FIG. 7, with the p substrate of the red GaAlAs light emitting diode disposed next to the mounting surface and the n substrate of the green GaP light emitting diode furthest from the mounting surface, only one power supply is required to drive both light emitting diodes as shown in FIG. 8(b).

Although the present invention has been fully described by way of example with reference to the accompanying drawings, it is to be noted here that various changes and modifications will be apparent to those skilled in the art. Therefore, unless otherwise such changes and modifications depart form the scope of the present invention, they should be construed as included therein.

What is claimed is:

1. A method of manufacturing a GaP green light emitting diode comprising the steps of:

a) forming a first monocrystalline epitaxial layer of n-type formed on a semiconductor substrate by bringing said semiconductor substrate into contact with a first growth solution at a first temperature and thereafter, lowering the temperature to a second temperature;

b) forming a second monocrystalline epitaxial layer of p-type formed on said formed first epitaxial layer by further lowering the second temperature to a third temperature and then cutting off said first growth solution to form an epitaxial wafer; and c) forming a third monocrystalline epitaxial layer of p-type formed on said second epitaxial layer by causing a second growth solution to contact said second epitaxial layer of said epitaxial wafer at a fourth temperature, and thereafter, lowering the temperature to a fifth temperature so that said third epitaxial layer forms a base for mounting the diode.

2. The method of claim 1, wherein said step c) said second growth solution is a GaP—Ga growth solution in which a p-type impurity of Zn has been preliminarily dissolved.

3. The method of claim 1, wherein said second monocrystalline epitaxial layer has a thickness of greater than 35 µm.

4. The method of claim 1, wherein the first temperature of the first growth solution is 1000° C.

5. The method of claim 1, where the second temperature is 900° C. and first temperature is lowered to the second temperature at a rate in the range of 0.1° C./minute to 3.0° C./minute.

6. The method of claim 1, wherein the third temperature is 830° C. and the second temperature is lowered to the third temperature at a rate in the range of 0.1° C./minute to 5.0° C./minute.

7. The method of claim 1, wherein the epitaxial wafer is pretreated with a aqua regia etching solution prior to formation of the third monocrystalline epitaxial layer.

8. The method of claim 1, wherein the epitaxial wafer is pretreated with a sulfuric acid etching solution prior to formation of the third monocrystalline epitaxial layer.

9. The method of claim 1, wherein the fourth temperature of the second growth solution is in the range of 1000° C. to 1020° C.

10. The method of claim 1, wherein the fifth temperature is 750° C. and the fourth temperature is lowered to the fifth temperature at a rate in the range of 0.1° C./minute to 5.0° C./minute.

11. A method of manufacturing a light emitting diode for emitting red and green light comprising the steps of:

(a) manufacturing a GaP green light emitting diode including the steps of, (a)(1) forming a first monocrystalline epitaxial layer of n-type formed on a first semiconductor substrate by bringing said first semiconductor substrate into contact with a first growth solution at a first temperature and thereafter lowering the temperature to a second temperature, (a)(2) forming a second monocrystalline epitaxial layer of p-type formed on said first epitaxial layer by further lowering the second temperature to a third temperature and then cutting off said first growth solution to form an epitaxial wafer, and (a)(3) forming a third monocrystalline epitaxial layer of p-type formed on said epitaxial layer by causing a second growth solution to contact said second epitaxial layer of said epitaxial wafer at a fourth temperature so that said third epitaxial layer forms a base for mounting said GaP green light emitting diode;

(b) manufacturing a GaAlAs red light emitting diode wherein a p-n junction of said GaAlAs red light emitting diode is matched to a p-n junction of said GaP green light emitting diode; and (c) mounting said GaP green light emitting diode and said GaAlAs red light emitting on a mounted surface such that the p-n junction heights of both diodes are matched.

12. The method of claim 1, wherein the GaAlAs red light emitting diode includes:

a second semiconductor substrate of p-type for forming the base for mounting said GaAlAs red light emitting diode, a fourth epitaxial layer of p-type disposed on said second substrate, and a fifth epitaxial layer of n-type disposed on said fourth epitaxial layer.

13. The method of claim 11, wherein said second monocrystalline epitaxial layer of said GaP green light emitting diode has a thickness of greater than 35 µm.

14. The method of claim 11, wherein the first temperature of the first growth solution is 1000° C.

15. The method of claim 11, wherein the second temperature is 900° C. and the first temperature is lowered to the second temperature at a rate in the range of 0.1° C./minute to 3.0° C./minute.

16. The method of claim 11, wherein the third temperature is 830° C. and the second temperature is lowered to the third temperature at a rate in the range of 0.1° C./minute to 5.0° C./minute.

17. The method of claim 11, wherein the epitaxial wafer is pretreated with a aqua regia etching solution prior to formation of the third monocrystalline epitaxial layer.

18. The method of claim 11, wherein the epitaxial wafer is pretreated with a sulfuric acid etching solution prior to formation of the third monocrystalline epitaxial layer.

19. The method of claim 11, wherein the fourth temperature of the second growth solution is in the range of 1000° C. to 1020° C.

20. The method of claim 11, wherein the fifth temperature is 750° C. and the fourth temperature is lowered to a fifth temperature at a rate in the range of 0.1° C./minute to 5.0° C./minute.

* * * * *